(12) United States Patent
Shao et al.

(10) Patent No.: US 11,252,844 B2
(45) Date of Patent: Feb. 15, 2022

(54) LIQUID DISTRIBUTION FOR ELECTRONIC RACKS

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/895,973

(22) Filed: Jun. 8, 2020

(65) Prior Publication Data

US 2021/0385978 A1 Dec. 9, 2021

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/20272* (2013.01)

(58) Field of Classification Search
CPC .......... H05K 7/20772; H05K 7/20818; H05K 7/20763; H05K 7/1491; H05K 7/20281; H05K 7/2029; H05K 7/20645; H05K 7/20809; H05K 7/183; H05K 7/20218; H05K 7/20327; H05K 7/20536; H05K 7/20627; H05K 7/20636; H05K 7/20727; H05K 7/208; H05K 7/20927; H05K 7/20781; H05K 7/1489; H05K 7/20272; H05K 7/1474; H05K 77/2029; H05K 7/20; H05K 1/0203; H05K 1/0201; H05K 7/20009; H05K 7/1485; H05K 7/20709; H05K 7/20736; G06F 1/20; G06F 2200/201; G06F 1/206

See application file for complete search history.

(56) References Cited

U.S. PATENT DOCUMENTS

| 8,351,206 B2 * | 1/2013 | Campbell | H05K 7/20809 361/700 |
| 2004/0221604 A1 * | 11/2004 | Ota | H05K 7/20781 62/259.2 |
| 2010/0002393 A1 * | 1/2010 | Campbell | H05K 7/20772 361/699 |
| 2011/0313576 A1 * | 12/2011 | Nicewonger | F28D 15/00 700/282 |
| 2013/0025818 A1 * | 1/2013 | Lyon | H05K 7/20781 165/11.1 |
| 2018/0199117 A1 * | 7/2018 | Mankinen | H04Q 1/142 |
| 2018/0242478 A1 * | 8/2018 | Cui | H05K 7/20772 |
| 2018/0303007 A1 * | 10/2018 | Gao | H05K 7/20272 |
| 2020/0163251 A1 * | 5/2020 | Chopra | H05K 7/20636 |
| 2020/0409009 A1 * | 12/2020 | Marcouiller | B65H 49/28 |

* cited by examiner

*Primary Examiner* — Michael A Matey
(74) *Attorney, Agent, or Firm* — Womble Bond Dickinson (US) LLP

(57) ABSTRACT

According to one embodiment, a liquid distribution system includes a main liquid supply and return unit, a mounting rail that extends along at least a portion of a height of the electronic rack, and a connecting unit that is slidably coupled to the mounting rail and is coupled to the main liquid supply and return unit via a flexible supply line and a flexible return line, the connecting unit is arranged to couple to a piece of information technology (IT) equipment to circulate coolant from the main liquid supply and return unit through the piece of IT equipment to create a heat-transfer loop that transfers thermal energy away from the piece of IT equipment and into the coolant.

20 Claims, 7 Drawing Sheets

LIQUID DISTRIBUTION FOR ELECTRONIC RACKS

FIELD

Embodiments of the present disclosure relate generally to a liquid distribution system for an electronic rack.

BACKGROUND

Thermal management for a data center that includes several active electronic racks is critical to ensure proper performance of servers and other equipment that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers.

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs). Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

An electronic rack may utilize both liquid cooling and air cooling, in which some equipment is liquid cooled and others are air cooled. In this case, the rack may include a rack manifold that is manufactured with a determined number of flow distribution ports in fixed locations. In some instances, the rack may include less ports than the number of pieces of equipment that may be mounted within the rack. Meaning, some locations within the rack are designated for liquid cooling equipment, while other locations may be designated for air cooling equipment (since these locations may not include flow distribution ports). Thus, the locations at which liquid cooled equipment may be mounted within the rack are limited to the available port locations, and the total number of liquid cooled equipment is limited to the total number of ports of the rack manifold. As a result, the configuration of mounted liquid cooled and air cooled equipment within the rack is contingent on the defined number and locations of the ports.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
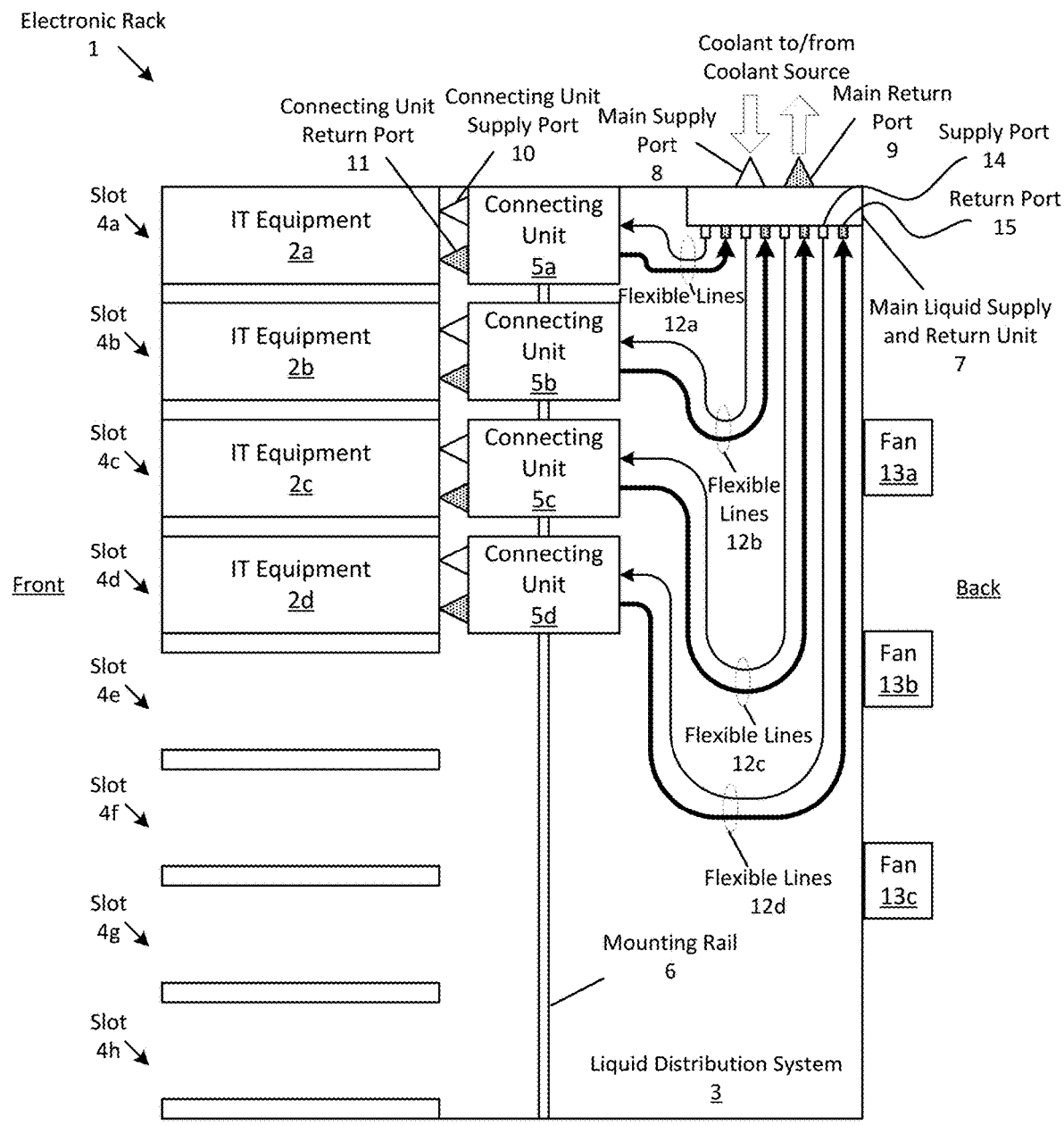
FIG. 1 shows a side view of an inside of an electronic rack with a liquid distribution system according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of dynamically configuring an electronic rack, which may include a mixture of air cooling and liquid cooling solutions populated therein. The electronic rack may include several slots that form a stack, each for receiving a piece of Information Technology (IT) equipment that may either be liquid cooled or air cooled (or a combination of both). The present disclosure describes a liquid distribution system for the electronic rack that includes a main liquid supply and return unit, at least one mounting rail that extends along at least a portion of a height of the electronic rack, and at least one connecting unit that is coupled to the main liquid supply and return unit via a flexible supply line and a flexible return line. The connecting unit is slidably coupled to the mounting rail and may be arranged to couple to a piece of IT equipment that is housed within one of the rack's slots, via a supply port and a return port to create a heat-transfer loop. For instance, the connecting unit may slide up and down the mounting rail to couple to any piece of IT equipment within the stack. Thus, the configuration of liquid and air cooled pieces of IT equipment housed within the stack is not contingent on specific locations at which flow ports are located. Rather, the present disclosure provides a flexible liquid cooling solution in which the position of connecting units (along the mounting rail) may be adjusted to provide liquid cooling according to the location at which liquid cooled pieces of IT equipment are housed within the stack.

In addition, the flow distribution system of the present disclosure may be configured to accommodate any number of liquid cooled pieces of IT equipment. For instance, unlike rack manifolds that have a determined number of flow distribution ports, the flow distribution system described herein may be equipped with one or more connecting units that may be removably coupled to the mounting rail and to the main liquid supply and return unit (via flexible lines), and arranged to couple to different pieces of IT equipment in order to create individual heat-exchanging loops. In other words, connecting units may be added or removed from the flow distribution system based on the racks liquid cooling needs. Thus, as a demand for the number of ports changes based on the number of liquid cooled pieces of IT equipment that are mounted within the rack, the number of connecting units may be adjusted to accommodate the demand.

Being able to adjust the number of connecting units may provide a level of redundancy. As described herein, multiple connecting units may be slidably coupled to the mounting rail. In case of a failure of a connecting unit (e.g., a coolant leak), the failed connecting unit may be decoupled from the respective piece of IT equipment, removed from the mounting rail, and another (redundant) connecting unit may take its place. Thus, individual heat-exchanging loops may be replaced and interchanged with different connecting units, which provides redundancy, prevents water leaking during operation, and helps uniformly distribute flow rate. In addition, being able to configure the number of connecting units may reduce the overall costs of the electronic racks. For instance, conventional rack manifolds may be expensive and may not be fully utilized (e.g., half of the ports may be coupled to liquid cooling equipment). The flow distribution system of the present disclosure, however, provides a configurable liquid cooling solution in which the number of connecting units required may be adjusted according to each rack's liquid cooling requirements.

According to one embodiment, a liquid distribution system for an electronic rack includes: a main liquid supply and return unit, a mounting rail that extends along at least a portion of a height of the electronic rack, and a connecting unit that is slidably coupled to the mounting rail and is coupled to the main liquid supply and return unit via a flexible supply line and a flexible return line, the connecting unit is arranged to couple to a piece of information technology (IT) equipment to circulate coolant from the main liquid supply and return unit through the piece of IT equipment to create a heat-transfer loop that transfers thermal energy away from the piece of IT equipment and into the coolant.

In one embodiment, the connecting unit is arranged to removably couple to the piece of IT equipment via a supply port and a return port. In another embodiment, the main liquid supply and return unit is removably coupled to a coolant source via a main supply port and a main return port to 1) receive the coolant from the coolant source and 2) provide warmed coolant produced by the transfer of thermal energy into the coolant to the coolant source. In some embodiments, the liquid distribution system further comprises a liquid manifold that is arranged to couple the connecting unit to one or more pieces of IT equipment to create individual heat-transfer loops for each piece of IT equipment. In one embodiment, the liquid distribution system further includes a container that is disposed between the connecting unit and the main liquid supply and return unit and is dimensioned to house at least a portion of each of the flexible supply line and the flexible return line.

In some embodiments, the connecting unit is a first connecting unit, the liquid distribution system further includes a second connecting unit that is slidably coupled to the mounting rail below the first connecting unit, wherein both connecting units are arranged to slide along the mounting rail independently from one another. In another embodiment, the mounting rail includes a top portion that extends along a top half of the electronic rack and a bottom portion that extends along a bottom half of the electronic rack, the first connecting unit is slidably coupled to the top portion and the second connecting unit is slidably coupled to the bottom portion, each of the connecting units is arranged to only slide along their respective portions. In one embodiment, the flexible supply line is a first flexible supply line and the flexible return line is a first flexible return line, the second connecting unit is coupled to the main liquid supply and return unit via a second flexible supply line and a second flexible return line, and the first flexible supply and return lines are sized such that the first connecting unit is prevented by the first flexible supply and return lines from sliding below atop half of the mounting rail while the first connecting unit is coupled to the main liquid supply and return unit and the second flexible supply and return lines are sized differently than the first flexible supply and return lines such that the second connecting unit is not prevented by the second flexible supply and return lines from sliding along an entire length of the mounting rail while the second connecting unit is coupled to the main liquid supply and return unit.

According to another embodiment, an electronic rack includes several slots arranged in a stack, each slot for receiving at least one piece of Information Technology (IT) equipment that is configured to provide data processing services and a liquid distribution system that is similar to the liquid distribution system previously described.

According to another embodiment, a data center includes at least one data center IT room that includes one or more electronic racks that are similar to the electronic rack previously described.

As described herein, to "couple" one component to another component may refer to fluidly coupling both components together thereby allowing a fluid, such as a liquid coolant (or coolant) and/or a vapor, to flow between the two components. For example, to fluidly couple one line (tube or hose) to another line refers to coupling (or connecting) the two lines such that fluid may flow from one line into the other line. In another embodiment, to "couple" one component to another component may refer to slidably coupling both components together, thereby allowing one component to slide (or move) in (at least) one direction with respect to the other component, while still being coupled together. For instance, slidably coupling a component (e.g., a connecting unit as described herein) and a rail together may refer to coupling (or mounting) the component to the rail, while the component may be (e.g., manually) slid in a longitudinal direction along (at least a portion of) a length of the rail.

FIG. 1 shows a side view of an inside of an electronic rack with a liquid distribution system according to one embodiment. Specifically, this figure illustrates an electronic rack 1 (hereafter may be referred to as "rack") that may be arranged for liquid cooling and/or air cooling one or more pieces of IT equipment that includes a liquid distribution system 3. In one embodiment, the electronic rack 1 may be a standard rack with (e.g., a chassis with) standard dimensions, such as a typical full-size 42 U rack. In another embodiment, the rack may be any size with any dimensions.

The electronic rack 1 includes eight slots 4a-4h, the liquid distribution system 3, a main supply port 8, a main return port 9, and three fans 13a-13c. Each of the slots is dimensioned to receive and house (or contain) one or more pieces of IT equipment. For instance, slots 4a-4d each include a piece of IT equipment, each of which may be inserted into their respective slots from the front of the rack. The remaining slots 4e-4h remain empty. In one embodiment, equipment may be inserted from the front and/or back of the rack. In one embodiment, the rack may include more or less slots than the eight illustrated. For instance, the rack may include forty-two slots, each for containing at least one piece of IT equipment that has a height of 1 U. In another embodiment, the pieces of IT equipment can have any height, such as 1 U, 2 U, 3 U, or 4 U.

Each of the pieces of IT equipment 2a-2d may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to a cold plate as described herein. One piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, while the pieces of IT equipment are operational (e.g., performing data processing tasks), the pieces of IT equipment may generate heat that is to be removed due to air cooling solutions and/or liquid cooling solutions, as described herein.

In one embodiment, the rack 1 may include a power supply unit (PSU) and/or a battery backup unit (BBU), each of which may be mounted within one or more slots. The PSU may include the necessary circuitry (e.g., an alternating current (AC) to direct current (DC) or DC to DC power converter, backup battery, transformer, or regulator, etc.,) to provide power to the rest of the components of electronic rack. The BBU may be configured to provide battery backup power to the electronic when a (main) power supply (provided by the PSU) is unavailable (e.g., a power outage).

Each of the fans 13a-13c is mounted on the back of the electronic rack 1 and is arranged to generate airflow to provide an air cooling to one or more pieces of IT equipment that are housed within the rack. For instance, fans 13a-13c may generate airflow flowing from the front of the rack, traveling through an inside of the rack (e.g., an air space of at least some of the equipment housed within the rack), and exiting the back of the rack. In another embodiment, the fans may generate an opposite airflow, meaning that the air flows from the back of the rack towards the front. In another embodiment, at least some fans may be mounted on the front of the rack. In some embodiments, each of the fans may be associated with at least one of the pieces of IT equipment. For instance, fan 13a may be disposed on the rack such that it generates an airflow for the piece of IT equipment 2a. In this case, the rack may include at least one fan for each piece of IT equipment contained within the rack. In another embodiment, the rack may have less fans than slots, as illustrated in this figure.

Figure 2:
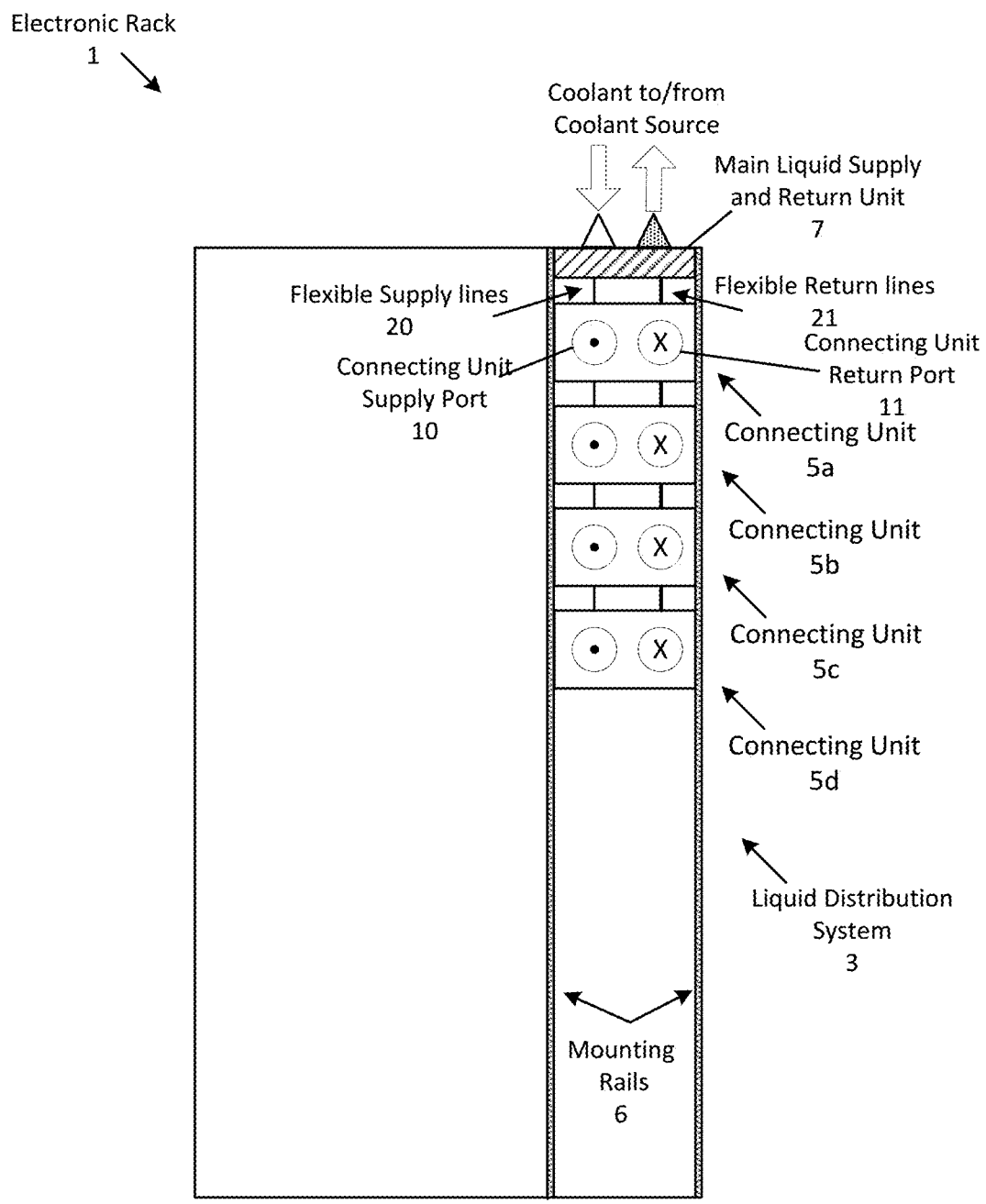
FIG. 2 shows a front view of the electronic rack with the liquid distribution system according to one embodiment.

The liquid distribution system 3 includes a mounting rail 6, a main liquid supply and return unit 7, four connecting units 5a-5d, and four pairs of flexible lines 12a-12d. In one embodiment, the system may include or more less components, such as having one or more connecting units and one or more mounting rails (as shown in FIG. 2). As shown, the liquid distribution system is housed (e.g., integrated) within (e.g., a chassis or frame of) the electronic rack 1. In another embodiment, the liquid distribution system may be (at least partially) separate from the electronic rack. For example, the system may be contained within a separate unit (or chassis). In another embodiment, at least some of the components may be contained within the electronic rack, such as the connecting units 5a-5d and mounting rail 6. In this case, the main liquid supply and return unit may be within the separate unit.

The mounting rail 6 is a structure that is arranged for mounting (e.g., slidably coupling) one or more connecting units, and is dimensioned to extend along at least a portion of a height of the electronic rack (e.g., in a vertical direction). As illustrated, the mounting rail extends along the height of the electronic rack. Specifically, the mounting rail is disposed inside the rack and is fastened (e.g., via one or more fasteners) to the inside (wall) of the rack, and is extending along the height of the inside of the rack. Also shown, the mounting rail is positioned adjacent to the slots 4a-4h, such that connecting units that are coupled to the rail may be fluidly coupled to one or more pieces of IT equipment that are housed within the slots via ports in order to circulate coolant through the pieces of IT equipment, as describe herein.

In one embodiment, the mounting rail 6 includes one or more (e.g., threaded) holes (e.g., as illustrated in FIG. 2) that may be separated from one another at a mounting-hole distance that satisfies a standard rack specification, such as EIA-310 for a standard rack. As a result, a connecting unit that is coupled to the mounting rail may be positioned next to (or adjacent to) any slot within the stack in order for the connecting unit to couple to a piece of IT equipment that is inserted within the slot. More about connecting pieces of IT equipment to connecting units is described herein.

In one embodiment, the connecting units 5a-5d may include one or more mechanisms that enable the units to slide along the mounting rail 6. In one embodiment, the connecting units may include a rail (e.g., that is coupled to the side of the connecting unit) that is arranged to slide along the mounting rail, when both rails are coupled. The connecting unit may slide along the mounting rail 6 to a particular location (e.g., by a technician) and be mounted in place by coupling the unit to the mounting rail 6 via one or more bolts (or fasteners) that are inserted into the holes of the mounting rail. In another embodiment, the connecting units may include any mechanism that enables the units to slide along the mounting rail and to be coupled to a particular location along the rail. In one embodiment, each of the connecting units may slide along (at least a portion of) the mounting rail 6 independently from one another. In some embodiments, at least some of the connecting units may be removably coupled to the mounting rail 6. Thus, connecting units may be added to or removed from the liquid distribution system 3.

Each of the connecting units 5a-5d is configured to removably couple to one or more pieces of IT equipment, via a connecting unit supply port (or supply port) 10 and a connecting unit return port (or return port) 11. Specifically, as shown, the connecting units 5a-5d are each coupled to pieces of IT equipment 2a-2d, respectively, via supply and return ports. In one embodiment, each of the ports may include a connector, such as a dripless blind matting quick disconnect. For instance, each of the ports may be a male-type dripless connector. In this case, the pieces of IT equipment may include two female-type dripless connectors. To couple a piece of IT equipment, such as 2a, to a connecting unit, such as 5a, the connecting unit may be first positioned adjacent to slot 4a. Once positioned, the piece of IT equipment 2a may be inserted into the slot 4a, and then pushed into the slot until connectors of the piece of IT equipment couple (or mate) with corresponding connectors of connecting unit 5a. In one embodiment, the piece of IT equipment may include the male-type connector, while the connecting unit includes the female-type connector.

Each of the connecting units 5a-5d is configured to fluidly couple to the main liquid supply and return unit 7 via pairs flexible lines 12a-12d (each pair including a flexible supply line 20 and a flexible return line 21, as shown in FIG. 2). In one embodiment, each of the connecting units may include two ports, an inlet port and an outlet port (not shown) that fluidly couple to the supply and return ports 10 and 11, such that coolant may flow between the coupled ports. For instance, a connecting unit may include at least two internal lines, where the inlet port couples to the supply port 10 via at least one line, and the outlet port couples to the return port 11 via at least another line. Thus, in this example the inlet port is arranged to couple to the flexible supply line 20 and the outlet port is arranged to couple to the flexible return line 21. In one embodiment, the inlet port and outlet port may include connectors, such as dripless mating quick disconnects that are arranged to removably couple to their respective flexible lines (e.g., the inlet and outlet ports may include female-type connectors, while the flexible lines include male-type connectors).

In one embodiment, each of the connecting units 5a-5d is arranged to fluidly couple to a piece of IT equipment to circulate coolant from the main liquid supply and return unit through the piece of IT equipment (e.g., through ports 10 and 11) to create a heat-transfer loop that transfers thermal energy away from the piece of IT equipment (e.g., while the piece of IT equipment is in operation, such as providing data processing services) and into the coolant. More about creating heat-transfer loops is described herein.

The main liquid supply and return unit 7 is arranged to removably couple the coolant source (not shown) to one or more connecting units (e.g., units 5a-5d) in order to allow coolant to circulate through each of the connecting unit's respective heat-transfer loop. In one embodiment, the return unit removably couples to the coolant source via the main supply port 8 and the main return port 9. In one embodiment, the ports 8 and 9 may be a part of the electronic rack. In another embodiment, the ports 8 and 9 may be a part of the main liquid supply and return unit 7. In one embodiment, the main supply port 8 may be coupled to a supply line (not shown) to receive coolant from the coolant source, and the main return port 9 may be coupled to a return line (not shown) to return (or provide) warmed coolant produced by the transfer of thermal energy into the coolant by one or more pieces of IT equipment back to the coolant source. In one embodiment, the ports 8 and 9 may include connectors, such as dripless blind mating disconnects, as described herein.

The main liquid supply and return unit 7 includes four pairs of ports, where each pair is coupled to a connecting unit via respective flexible lines. Each pair of ports includes a supply port 14 that is arranged to couple to a flexible supply line 20 that is coupled to a connecting unit, and includes a return port 15 that is arranged to couple to a flexible return line 21 that is coupled to the same connecting unit, such as flexible lines 12a that are coupling connecting unit 5a to the main liquid supply and return unit 7. In one embodiment, at least some of the pairs of supply ports may be arranged to removably couple to the flexible lines. In this case, the ports may include connectors, such as dripless mating quick disconnects, as described herein. In some embodiments, the main liquid supply and return unit 7 may include more or less pairs of ports (e.g., to allow more or less connecting units to couple to the return unit).

In one embodiment, the main liquid supply and return unit 7 may include a main fluid distribution manifold (not shown) that is configured to couple each of the connecting units to the coolant source in order to create individual heat-transfer loops. For example, once each of the (e.g., connecting unit supply ports 10 and connecting unit return ports 11 of each of the) connecting units couples to a piece of IT equipment, coolant may circulate as follows. The main liquid supply return unit 7 receives coolant from the coolant source via the main supply port 8, and provides the coolant to each of the connecting units via a respective flexible supply line. The coolant flows through each connecting unit and into its respective piece of IT equipment via connecting unit's connecting unit supply port 10. Each piece of IT equipment transfers heat into the coolant, producing warmed coolant which is then returned back to the connecting unit via the connecting unit's connecting unit return port 11. The warmed coolant flows through each connecting unit and back to the main liquid supply and return unit 7 via a respective flexible return line. Here, the warmed coolant from each of the connecting units mixes together and is returned (or provided) to the coolant source via the main return port 9. In some embodiments, the coolant may cease to circulate in any of the heat-transfer loops, once the loop is broken (e.g., a piece of IT equipment is disconnected from its respective connecting unit. If this occurs, however, coolant may still flow through the remaining heat-transfer loops.

In one embodiment, the main liquid supply and return unit 7 may include a cooling distribution unit (CDU) that is configured to provide liquid cooling. In one embodiment, the CDU may include at least one of a heat exchanger, a liquid pump, one or more monitoring sensors, a liquid reservoir, and/or a pump controller. In some embodiments, the heat exchanger may be a liquid-to-liquid heat exchanger. The heat exchanger may couple to the main supply port 8 and the main return port 9 to form a primary loop with the coolant source. In addition, the heat exchanger may include an inlet that is coupled to each return port 15 and an outlet that is coupled to each supply port 14, thereby forming heat-transfer loops with each of the connecting units as secondary loops. In one embodiment, the heat exchanger may couple to each of the connecting units via a fluid distribution manifold. During operation, the heat exchanger may transfer heat from the warmed coolant supplied by each of the connecting units (via flexible return lines and the return ports) into coolant received from the coolant source (via the main supply port). Once the heat is extracted, cooled coolant may then be redistributed through each of the secondary loops. In one embodiment, the coolant in the secondary loops may be circulated via one or more liquid pumps. Thus, coolant within each of the secondary loops does not come into contact with coolant flowing within the primary loop. Note that the CDU can be any kind of CDUs commercially available or customized ones. Thus, the details of CDUs will not be described herein. In one embodiment, at least some of the components of the CDU may be mounted within at least one of the slots (e.g., the pump controller may be mounted to slot 4h).

As described herein, each of the components may couple to another via connectors, such as dripless blind mating quick disconnects. In one embodiment, each of the connectors may be the same type of connector, such as being the same type of connector and/or having the same dimensions. In this case, each of the connectors may have a same internal diameter. In another embodiment, however, at least some of the connectors may be different. For example, the connecting unit supply and return ports 10 and 11 of connecting unit 5a may have smaller connectors (with a smaller internal diameter), than ports of connecting unit 5b. As a result, the coolant flowrate through the heat-transfer loop of connecting unit 5a may be slower than the coolant flowrate through the heat-transfer loop of connecting unit 5b. In some embodiments, the connectors may be removably coupled to the ports, such that connectors of different types may be interchanged as needed (e.g., based on the type of connectors of the pieces of IT equipment).

In one embodiment, the flexible lines 12a-12d may be composed of any flexible material. For example, the lines may be composed of metal, such as copper, a polymer (e.g., an EPDM rubber), vinyl, and/or plastic (e.g., polyurethane). In one embodiment the supply lines (e.g., lines 20) may be different than the return lines (e.g., lines 21). For example, the supply lines may have a smaller internal diameter, while the return lines include a larger internal diameter. As described herein, the flexible lines may include any type of connector, such as dripless mating quick disconnects. In another embodiment, the flexible lines may include barbed fittings at either end of the flexible lines, such that a barbed fitting at one end of the flexible line couples to (e.g., the inlet port of) a connecting unit, and another barbed fitting at the other end of the flexible line couples to (e.g., the supply port 14 of) the main liquid supply and return unit 7.

In one embodiment, the flexible lines 12a-12d may be sized such that the connecting units 5a-5d may slide along at least a portion of the mounting rail 6, while remaining coupled to the main liquid supply and return unit via the flexible lines. Specifically, the flexible lines may have an excess length than is required for a respective connecting unit to couple to a piece of IT equipment in order to create the heat-transfer loop. This is illustrated by each of the flexible lines 12a-12d drooping below the connecting units to which each of the flexible lines couple. As a result, at least some of the connecting units may slide (or traverse) along the mounting rail. In one embodiment, each of the flexible lines 12a-12d may have a same length. In another embodiment, at least some of the flexible lines 12a-12d may have different lengths. More about the flexible lines is described herein.

In some embodiments, the electronic rack may include additional components, such as a rack management unit (RMU) which may be mounted in one or more of the slots of the electronic rack. The RMU is configured to provide and manage power supplied to the pieces of IT equipment 2a-2d, the fans 13a-13c, and/or other components (e.g., the main liquid supply and return unit 7). In one embodiment, the RMU may be coupled to the PSU to manage the power consumption of the PSU.

In one embodiment, RMU includes optimization module and rack management controller (RMC). The RMC may include a monitor to monitor operating status of various components within electronic rack, such as, for example, the equipment 2a-2d, the CDU of the return unit, and the fans 13a-13c. Specifically, the monitor receives operating data from various sensors representing the operating environments of electronic rack. For example, the monitor may receive operating data representing temperatures of the processors, cooling liquid, and airflows, which may be captured and collected via various temperature sensors. The monitor may also receive data representing the fan power and pump power generated by the fans and a liquid pump of the CDU, which may be proportional to their respective speeds. These operating data are referred to as real-time operating data. Note that the monitor may be implemented as a separate module within RMU.

Based on the operating data, optimization module performs an optimization using a predetermined optimization function or optimization model to derive a set of optimal fan speeds for one or more fans 13a-13c and an optimal pump speed for the liquid pump, such that the total power consumption of liquid pump and fans reach minimum, while the operating data associated with liquid pump and cooling fans of fan modules are within their respective designed specifications. Once the optimal pump speed and optimal fan speeds have been determined, RMC configures liquid pump and cooling fans based on the optimal pump speed and fan speeds.

As an example, based on the optimal pump speed, the RMC communicates with the pump controller of the CDU to control the speed of liquid pump, which in turn controls a liquid flow rate of coolant supplied to one or more of the connecting units 5a-5d to be distributed to equipment. Therefore, the operating condition and the corresponding cooling device performance are adjusted. Similarly, based on the optimal fan speeds, the RMC communicates with each of the fans 13a-13c to control the speed of each fan, which in turn control the airflow rates. Note that each of the fans may be individually controlled with its specific optimal fan speed, and different fan modules and/or different cooling fans within the same fan module may have different optimal fan speeds.

FIG. 2 shows a front view of the electronic rack 1 with the liquid distribution system 3 according to one embodiment. As shown, the liquid distribution system 3 may only occupy a portion of the total width of the rack. In one embodiment, the system may occupy a greater portion of the width in order to accommodate larger connecting units. In addition, this figure shows that the system includes two mounting rails, one mounting rail that may be fastened to the inside wall of the rack (as previously described), and another mounting rail that may be positioned along the inside of the rack (mounted to the top and bottom of the rack). Each of the connecting units may couple between both mounting rails and slide along the rails, as described herein. Also shown are the flexible supply lines 20 and the flexible return lines 21 of the flexible lines 12a-12d (totaling eight lines, four supply lines and four return lines).

Figure 3:
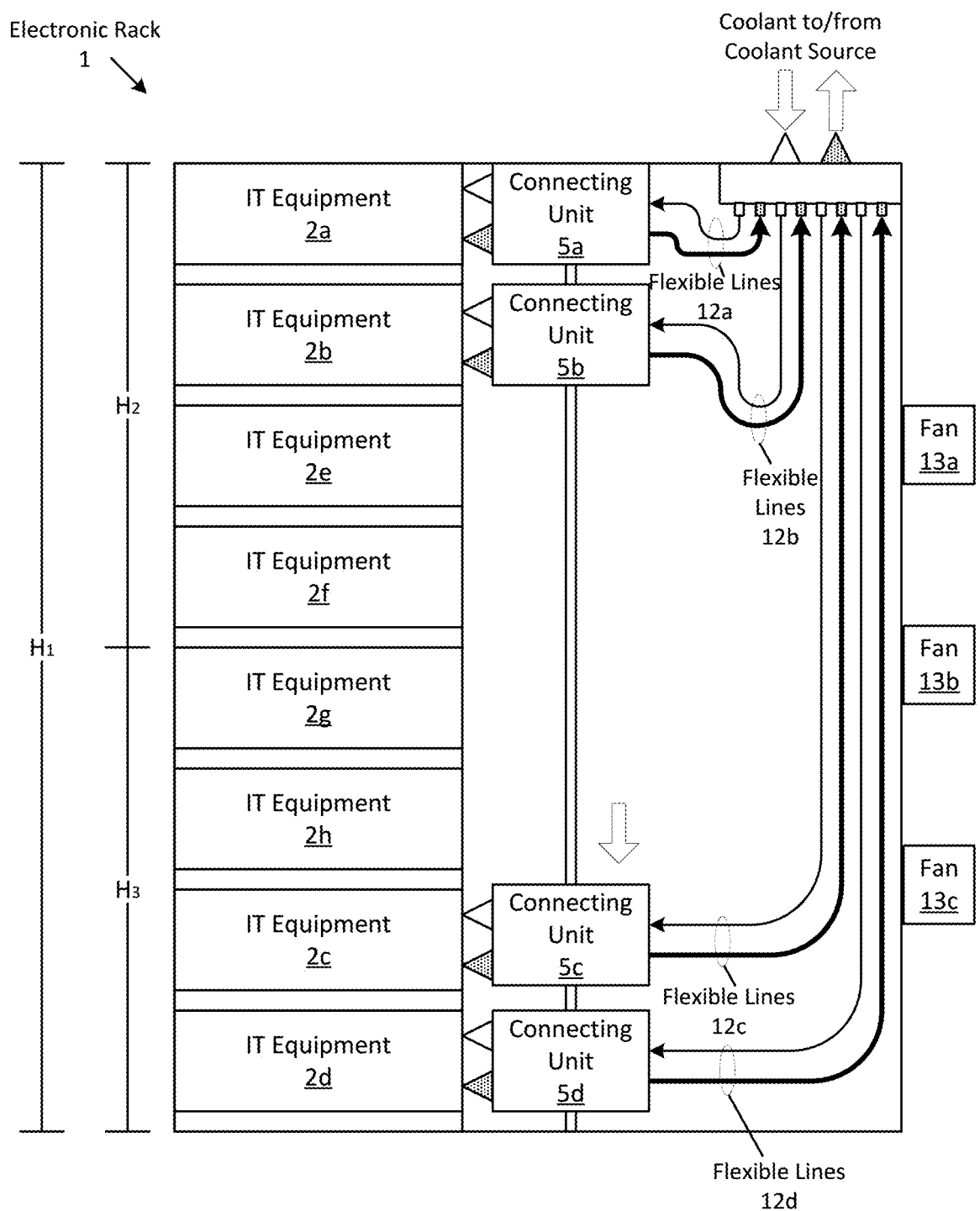
FIG. 3 shows that several connecting units of the liquid distribution system have been repositioned to liquid cool pieces of IT equipment housed within the electronic rack according to one embodiment.

FIG. 3 shows that several connecting units of the liquid distribution system have been repositioned to liquid cool pieces of IT equipment housed within the electronic rack according to one embodiment. In this figure, the electronic rack 1 has been reconfigured to include some pieces of IT equipment that are air cooled, and as a result some pieces of IT equipment that are liquid cooled are moved to different slots. Specifically, air-cooled pieces of IT equipment 2e-2h have been inserted into slots 4c-4f, respectively, while the liquid-cooled pieces of IT equipment 2c and 2d that were previously housed in slots 4c and 4d have been moved to slots 4g and 4h, respectively. In one embodiment, the positions of the pieces of IT equipment may have been changed due to processing requirements. As a result of the repositioning of the pieces of IT equipment 2c and 2d, the connecting units 5c and 5d have been moved down the mounting rail.

In one embodiment, a range of motion of each of the connecting units may be based on the size (e.g., length) of the unit's flexible lines. For example, flexible lines 12b may be sized such that connecting unit 5b is prevented by the lines from sliding below a top half (e.g., $H_2$) of the mounting rail (which may correspond to the top half of the inside of the electronic rack), while the connecting unit is coupled to the main liquid supply and return unit 7. For instance, the flexible lines 12b may become taut as the unit would begin to slide below $H_2$, thereby preventing the unit from moving any further. Other flexible lines, however, may be sized differently. For example, flexible lines 12d may be sized such that connecting unit 5d is not prevented by the lines from sliding along an entire length (e.g., $H_1$) of the mounting rail (which may correspond to the entire height of the inside of the electronic rack), while the connecting unit is coupled to the main liquid supply and return unit. Thus, the flexible lines 12d may not prevent the connecting unit 5d from sliding the length of the mounting rail. However, other connecting units above the connecting unit 5d may prevent its range of motion (e.g., beyond the next connecting unit that is above that unit, which in this case is connecting unit 5c).

In another embodiment, each of the connecting units may have a different range of motion based on their respective flexible lines. For example, flexible lines 12a may enable connecting unit 5a to have a first range of motion (e.g., allowing the unit to couple to pieces of IT equipment in slots 4a and 4b), while flexible lines 12b may enable connecting unit 5b to have a second range of motion (e.g., allowing the unit to couple to pieces of IT equipment in slots 4a-4d.

In some embodiments, the size of the flexible lines that couple the connecting units may be based on the position of the connecting unit along the stack of connecting units that are coupled to the mounting rail. For example, the lower the connecting unit within the stack, the longer the flexible lines. In another embodiment, the connecting units may be separated in two groups, each group having different sized flexible lines. For instance, a top half of connecting units (in this case 5a and 5b) may have a first sized flexible lines, while a bottom half of connecting units (in this case 5c and 5d) may have a second sized flexible lines. The first sized flexible lines may allow the top half of connecting units to have a range of motion along $H_2$, while the second sized flexible lines may allow the bottom half of connecting units to have another range of motion along $H_1$. In some embodiments, the bottom half of connecting units may have a range of motion along only a portion of the mounting rail, such as along a bottom half of the mounting rail (e.g., $H_3$).

Figure 4:
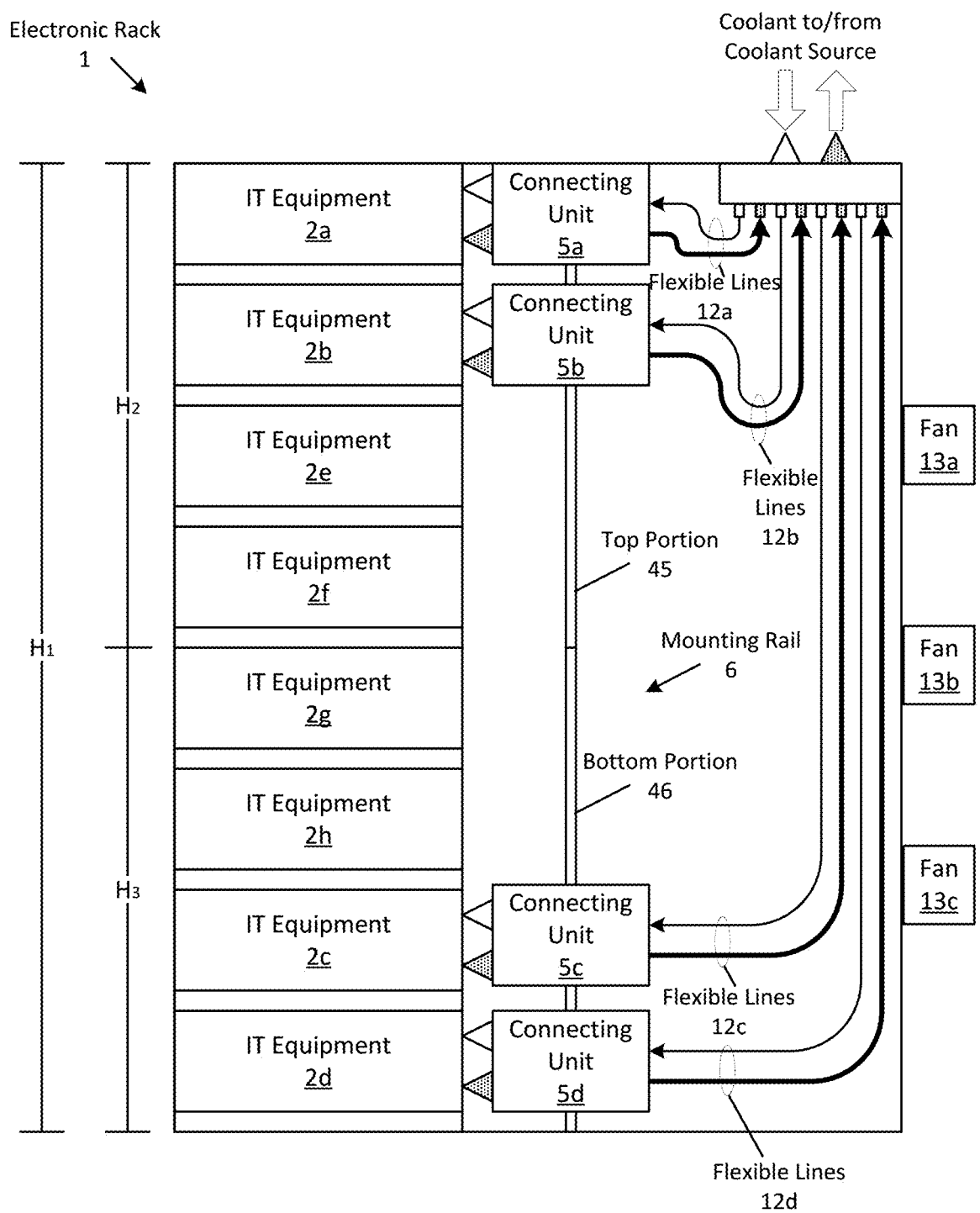
FIG. 4 shows several connecting units that are arranged to slide along separate portions of a mounting rail according to one embodiment.

FIG. 4 shows several connecting units that are arranged to slide along separate portions of a mounting rail according to one embodiment. Specifically, this figure shows that the mounting rail 6 includes atop portion 45 that extends along $H_2$ and a bottom portion 46 that extends along $H_3$. In one embodiment, both portions are separate from one another. Specifically, that connecting units 5a and 5b are slidably coupled to top portion 45 and are arranged to only slide along that portion, while connecting units 5c and 5d are slidably coupled to bottom portion 46 and are arranged to only slide along that portion. In one embodiment, connecting units coupled to the top portion 45 may have flexible lines with a first length, and connecting units coupled to the bottom portion 46 may have flexible lines with a second length that is longer than the first length.

Figure 5:
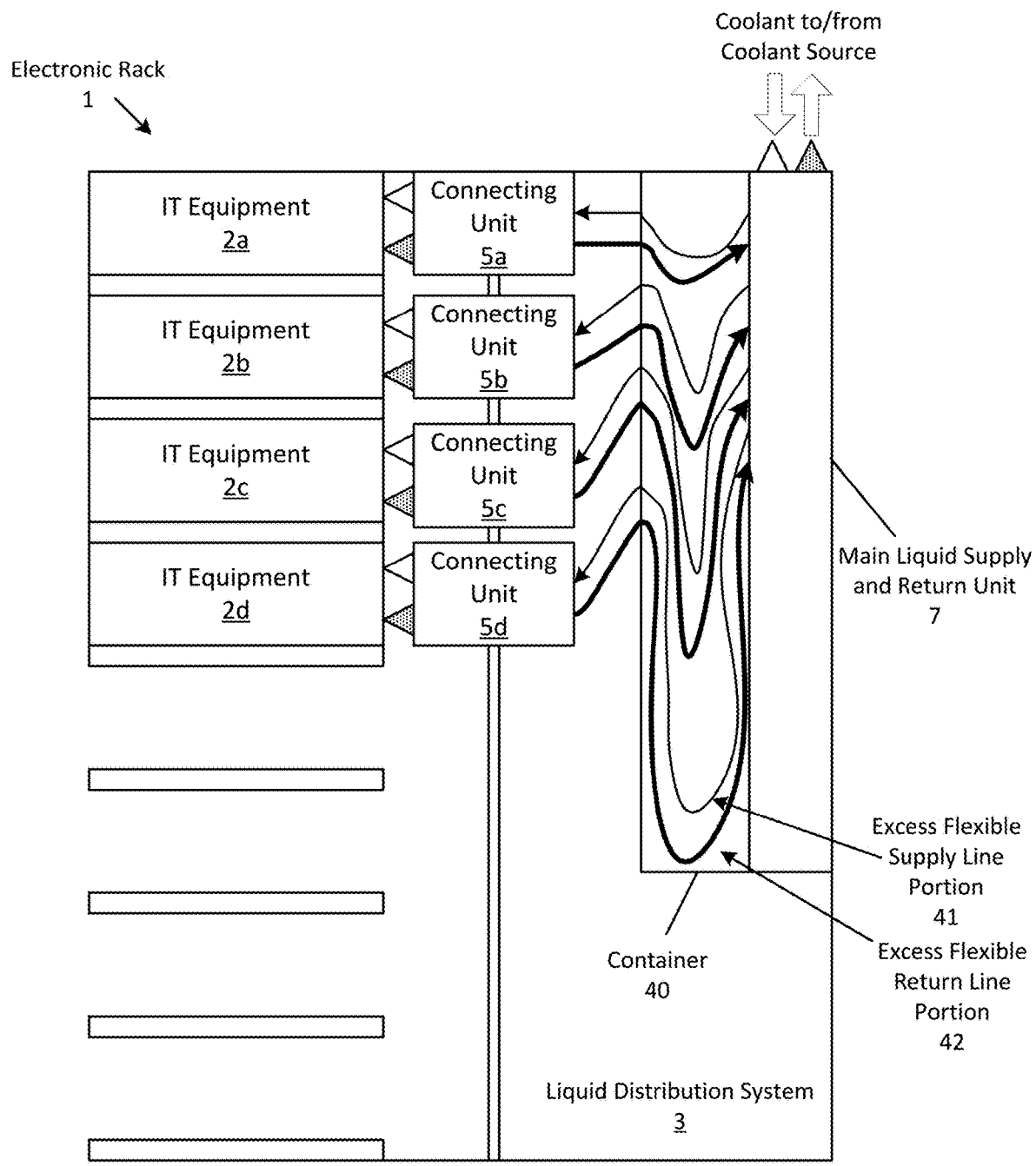
FIG. 5 shows an example of a container housing portions of flexible lines according to one embodiment.

FIG. 5 shows an example of a container housing portions of flexible lines according to one embodiment. Specifically, this figure shows that the liquid distribution system 3 includes a container 40 that is disposed between the connecting units 5a-5d and the main liquid supply and return unit 7 and is dimensioned to house at least a portion of each of the flexible lines 12a-12d. In particular, the container includes excess flexible supply line portions 41 and excess flexible return line portions 42, each being portions of the flexible lines 12a-12d. In one embodiment, these portions are excess portions that would otherwise be drooping below the lines respective connecting unit, as illustrated in FIG. 1. In some embodiments, the container is watertight, such that any leaks within the lines (or from the main liquid supply and return unit) may be contained within the container. In another embodiment, the container may include the return unit 7.

Figure 6:
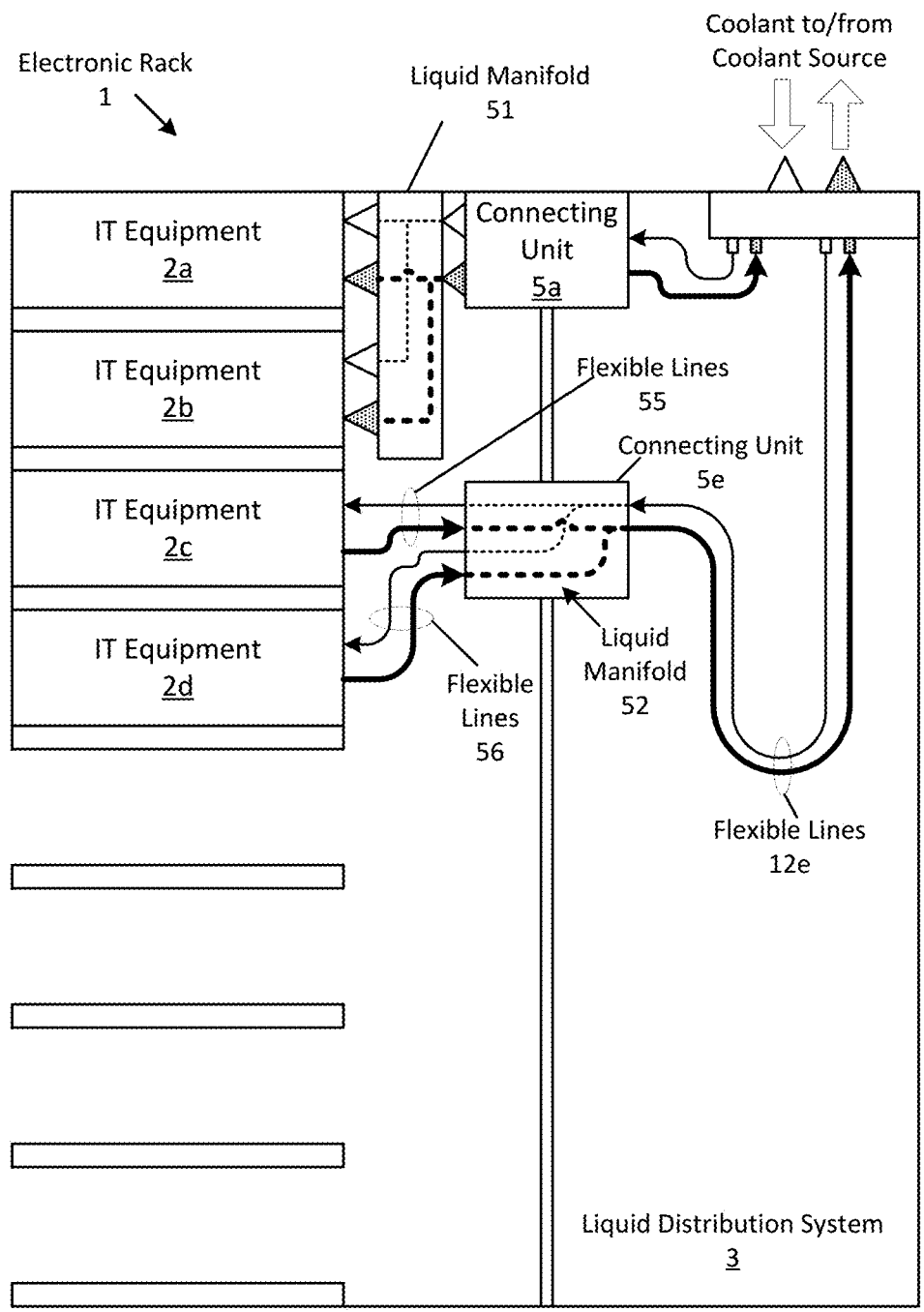
FIG. 6 shows an example of connecting units of the liquid distribution system coupled to several pieces of IT equipment according to one embodiment.

FIG. 6 shows an example of connecting units of the liquid distribution system coupled to several pieces of IT equipment according to one embodiment. As shown thus far, connecting units may couple to a particular piece of IT equipment, as illustrated in FIG. 1 for example. This figure illustrates several connecting units coupling to multiple pieces of IT equipment in order to provide liquid cooling. For example, the liquid distribution system 3 includes a liquid manifold 51 that is arranged to couple a connecting unit to one or more pieces of IT equipment to create individual heat-transfer loops for each piece of IT equipment. In particular, the liquid manifold 51 is coupled to the connecting unit supply port 10 and connecting unit return port 11 of connecting unit 5a, and is coupled to two pieces of IT equipment, 2a and 2b. As shown, the liquid manifold is arranged to receive coolant via the supply port 10 and supply the coolant to equipment 2a and 2b (e.g., via supply ports), and receive warmed coolant from the equipment (e.g., via return ports) and supply the warmed coolant to the connecting unit via return port 11. In one embodiment, the ports to which the pieces of IT equipment couple to may include connectors, as described herein.

As shown, the liquid manifold 51 is separate from connecting unit 5a. Thus, the manifold may be removably coupled to the connecting unit. This may allow any connecting unit to be converted into providing liquid cooling to multiple pieces of IT equipment. In another embodiment, the liquid manifold may be fixedly coupled to the connecting unit.

This figure also shows a connecting unit 5e in which a liquid manifold 52 is integrated therein. The connecting unit 5e is arranged to couple to one or more pieces of IT equipment in order to create individual heat-transfer loops. As shown, the connecting unit 5e is coupled to the piece of IT equipment 2c via flexible lines 55 and is coupled to the piece of IT equipment 2d via flexible lines 56. In one embodiment, the connecting unit may include multiple pairs of connecting unit flexible supply and return ports 10 and 11 that allow the connecting unit to couple to one or more pieces of IT equipment. Each of the supply and return ports may be coupled to the liquid manifold 52, which is coupled to the main liquid supply and return unit 7 via a single pair of flexible lines 12e.

Figure 7:
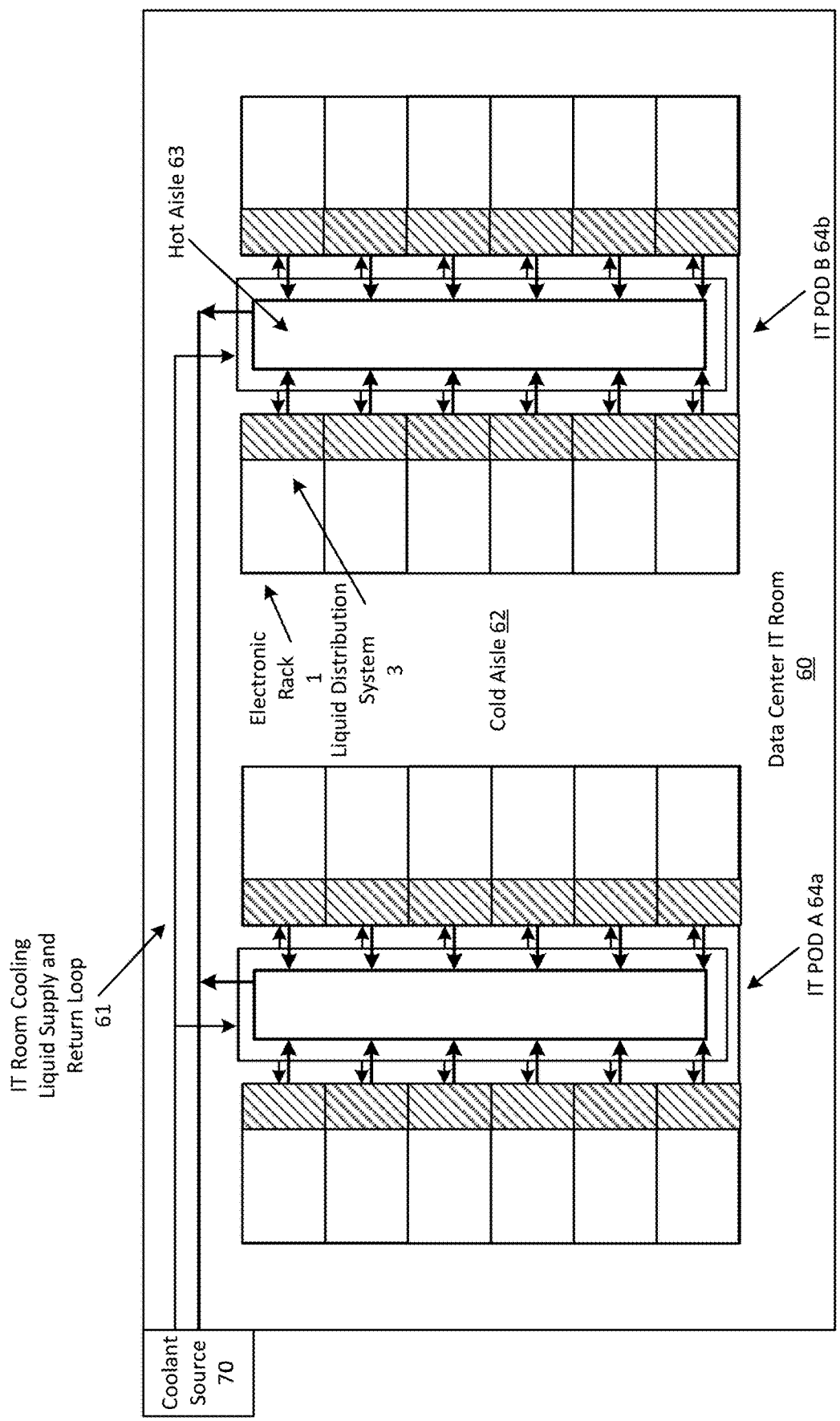
FIG. 7 shows an example of an IT room in a data structure with installed electronic racks that include liquid distribution systems according to one embodiment.

FIG. 7 shows an example of an IT room in a data structure with installed electronic racks that include liquid distribution systems according to one embodiment. Specifically, this figure illustrates a data center IT room 60 (of a data center) with two IT PODs, POD A 64a and POD B 64b, and an IT room cooling liquid and return loop 61 that is coupled to a coolant source 70. In one embodiment, the coolant source may be a single phase liquid-to-liquid heat exchanger. In another embodiment, the coolant source may be a data center cooling liquid system or an IT liquid cooling water system. In this case, the loop 61 may be a part of the system. In some embodiments, the coolant source may be any type of source configured to transfer heat away from warmed liquid coolant to produce cooled liquid coolant. As shown, the coolant source is separate from the data center IT room (e.g., outside). In one embodiment, the coolant source may be inside the room.

Each POD is surrounded by a cold aisle 62, and has a hot aisle 63 in the middle of the POD. Both IT PODs are populated with twelve electronic racks 1 that includes a liquid distribution system on each side of the hot aisle. Each of the liquid distribution systems is coupled to the IT room cooling liquid supply and return loop 61 in order to provide liquid cooling to the system's respective electronic rack. In one embodiment, some of the electronic racks may not include the liquid distribution system.

In one embodiment, at least some of the electronic racks may provide air cooling to some of the pieces of IT equipment housed therein. These racks may draw (e.g., using one or more fans) cool air from the cold aisle 62 in order transfer heat contained from one or more pieces of IT equipment (or IT components), thereby producing hot exhaust air that is pushed into the hot aisle 63. Warmed air in the hot aisle 63 may be air conditioned using any type of data center air condition unit and may be circulated back into the cold aisle 62. This design enables for air cooled components within the racks to be cooled in addition to liquid cooled components that are coupled to liquid distribution system as described herein.

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such the flowrate of one or more liquid pumps, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A liquid distribution system for an electronic rack, the liquid distribution system comprising:
   a main liquid supply and return unit;
   a mounting rail that extends along a height of at least two vertically stacked slots of the electronic rack, each slot arranged to receive one or more pieces of information technology (IT) equipment, the mounting rail comprising two separate and adjoining halves, a first half of the mounting rail only extending along a top half of the height and a second half of the mounting rail only extending along a bottom half of the height; and
   a first connecting unit that is slidably coupled to the first half of the mounting rail and a second connecting unit that is slidably coupled to the second half of the mounting rail, both connecting units being arranged to slide independently from one another,
   wherein the two adjoining halves are separate such that each of the connecting units is arranged to only slide along its respective half,
   wherein the first and second connecting units are each coupled to the main liquid supply and return unit via a pair of flexible supply and return lines,
   wherein each connecting unit is arranged to couple to a piece of IT equipment to circulate coolant from the main liquid supply and return unit through the piece of IT equipment to create a heat-transfer loop that transfers thermal energy away from the piece of IT equipment and into the coolant.

2. The liquid distribution system of claim 1, wherein each connecting unit is arranged to removably couple to its respective piece of IT equipment via a supply port and a return port.

3. The liquid distribution system of claim 1, wherein the main liquid supply and return unit is removably coupled to a coolant source via a main supply port and a main return port to 1) receive the coolant from the coolant source and 2) provide warmed coolant produced by the transfer of thermal energy into the coolant to the coolant source.

4. The liquid distribution system of claim 1 further comprising a liquid manifold that is arranged to couple at least one of the first and second connecting units to at least one piece of IT equipment to create individual heat-transfer loops for each piece of IT equipment.

5. The liquid distribution system of claim 1 further comprising a container that is disposed between the first and second connecting units and the main liquid supply and return unit and is dimensioned to house at least a portion of each flexible supply line and flexible return line.

6. The liquid distribution system of claim 1, wherein the liquid distribution system is disposed within a frame of the electronic rack that has an internal width that spans between a first inside wall and a second inside wall that is opposite to the first inside wall of the frame, wherein the liquid distribution system spans a width from the first inside wall that is less than the internal width.

7. The liquid distribution system of claim 6, wherein the mounting rail is a first mounting rail that is mounted to the first inside wall, wherein the liquid distribution system further comprises a second mounting rail that is disposed inside an open space within the frame and is coupled to a top and a bottom of the frame, wherein the first and second connecting units are slidably coupled to the first and second mounting rails.

8. The liquid distribution system of claim 1,
wherein the first and second connecting units are coupled to the mounting rail in a vertical stack,
wherein each connecting unit is coupled to the main liquid supply and return unit via a pair of flexible supply and return lines,
wherein each pair of flexible supply and return lines have a different length that corresponds to a position of their respective connecting unit within the vertical stack such that a first pair of flexible supply and return lines that are coupled to the first connecting unit have a first length and a second pair of flexible supply and return lines that are coupled to the second connecting unit that is positioned lower than the first connecting unit in the vertical stack have a second length that is longer than the first length.

9. An electronic rack comprising:
a plurality of vertically stacked slots, each slot for receiving at least one piece of Information Technology (IT) equipment that is configured to provide data processing services; and
a liquid distribution system comprising:
  a main liquid supply and return unit,
  a mounting rail that extends along a height of at least two vertically stacked slots of the plurality of vertically stacked slots, the mounting rail comprising two separate and adjoining halves, a first half of the mounting rail only extending along a top half of the height and a second half of the mounting rail only extending along a bottom half of the height, and
  a first connecting unit that is slidably coupled to the first half of the mounting rail and a second connecting unit that is slidably coupled to the second half of the mounting rail, both connecting units being arranged to slide independently from one another,
  wherein the two adjoining halves are separate such that each of the connecting units is arranged to only slide along its respective half,
  wherein the first and second connecting units are each coupled to the main liquid supply and return unit via a pair of flexible supply and return lines,
  wherein each the connecting unit is arranged to couple to a piece of IT equipment to circulate coolant from the main liquid supply and return unit through the piece of IT equipment to create a heat-transfer loop that transfers thermal energy away from the piece of IT equipment and into the coolant.

10. The electronic rack of claim 9, wherein each connecting unit is arranged to removably couple to its respective piece of IT equipment via a supply port and a return port.

11. The electronic rack of claim 9 further comprising a main supply port and a main return port that removably couple the main liquid supply and return unit to a coolant source to 1) receive the coolant from the coolant source and 2) provide warmed coolant produced by the transfer of thermal energy into the coolant to the coolant source.

12. The electronic rack of claim 9, wherein at least one of the connecting units comprises a liquid manifold that is arranged to couple the at least one of the connecting units to one or more pieces of IT equipment to create individual heat-transfer loops for each piece of IT equipment.

13. The electronic rack of claim 9, wherein the liquid distribution system further comprises a container that is disposed between the first and second connecting units and the main liquid supply and return unit and is dimensioned to house at least a portion of each flexible supply line and flexible return line.

14. The electronic rack of claim 9 further comprising a frame that includes the liquid distribution system and the plurality of slots disposed therein, the frame having an internal width that spans between a first inside wall and a second inside wall that is opposite to the first inside wall, wherein the liquid distribution system spans a width from the first inside wall that is less than the internal width.

15. The electronic rack of claim 14, wherein the mounting rail is a first mounting rail that is mounted to the first inside wall, wherein the liquid distribution system further comprises a second mounting rail that is disposed inside an open space within the frame and is coupled to a top and a bottom of the frame, wherein the first and second connecting units are slidably coupled to the first and second mounting rails.

16. The electronic rack of claim 9,
wherein the first and second connecting units are coupled to the mounting rail in a vertical stack,
wherein each connecting unit is coupled to the main liquid supply and return unit via a pair of flexible supply and return lines,
wherein each pair of flexible supply and return lines have a different length that corresponds to a position of their respective connecting unit within the vertical stack such that a first pair of flexible supply and return lines that are coupled to the first connecting unit have a first length and a second pair of flexible supply and return lines that are coupled to the second connecting unit that is positioned lower than the first connecting unit in the vertical stack have a second length that is longer than the first length.

17. A data center comprising:
a data center information technology (IT) room; and
one or more electronic racks within the IT room, each electronic rack including
  a plurality of vertically stacked slots, each slot is arranged to receive at least one piece of Information Technology (IT) equipment that is configured to provide data processing services; and
  a liquid distribution system comprising:
    a main liquid supply and return unit,
    a mounting rail that extends along a height of at least two vertically stacked slots of the plurality of vertically stacked slots, the mounting rail comprising two separate and adjoining halves, a first half of the mounting rail only extending along a top half of the height and a second half of the mounting rail only extending along a bottom half of the height, and a first connecting unit that is slidably coupled to the first half of the mounting rail and a second connecting unit that is slidably coupled to the second half of the mounting rail, both connecting units being arranged to slide independently form one another, wherein the two adjoining halves are separate such that each of the connecting units is arranged to only slide along its respective half, wherein the first and second connecting units are each coupled to the main liquid supply and return unit via a pair of flexible supply and return lines, wherein each connecting unit is arranged to couple to a piece of IT equipment to circulate coolant from the main liquid supply and return unit through the piece of IT equipment to create a heat-transfer loop that transfers thermal energy away from the piece of IT equipment and into the coolant.

18. The data center of claim 17, wherein the electronic rack further includes a frame that includes the liquid distribution system and the plurality of slots disposed therein, the frame having an internal width that spans between a first inside wall and a second inside wall that is opposite to the first inside wall, wherein the liquid distribution system spans a width from the first inside wall that is less than the internal width.

19. The data center of claim 18, wherein the mounting rail is a first mounting rail that is mounted to the first inside wall, wherein the liquid distribution system further comprises a second mounting rail that is disposed inside an open space within the frame and is coupled to a top and a bottom of the frame, wherein the first and second connecting units are slidably coupled to the first and second mounting rails.

20. The data center of claim 17,
wherein the first and second connecting units are coupled to the mounting rail in a vertical stack,
wherein each connecting unit is coupled to the main liquid supply and return unit via a pair of flexible supply and return lines,
wherein each pair of flexible supply and return lines have a different length that corresponds to a position of their respective connecting unit within the vertical stack such that a first pair of flexible supply and return lines that are coupled to the first connecting unit have a first length and a second pair of flexible supply and return lines that are coupled to the second connecting unit that is positioned lower than the first connecting unit in the vertical stack have a second length that is longer than the first length.

* * * * *